United States Patent
Gieskes

(10) Patent No.: US 7,040,137 B1
(45) Date of Patent: *May 9, 2006

(54) METHOD FOR IMPROVING PICK RELIABILITY IN A COMPONENT PLACEMENT MACHINE

(75) Inventor: Koenraad Gieskes, Binghamton, NY (US)

(73) Assignee: Universal Instruments Corporation, Binghamton, NY (US)

(*) Notice: Subject to any disclaimer, the term of this patent is extended or adjusted under 35 U.S.C. 154(b) by 159 days.

This patent is subject to a terminal disclaimer.

(21) Appl. No.: 10/627,927

(22) Filed: Jul. 28, 2003

Related U.S. Application Data

(63) Continuation-in-part of application No. 10/307,848, filed on Dec. 2, 2002, which is a continuation-in-part of application No. 09/947,099, filed on Sep. 5, 2001, now Pat. No. 6,625,878.

(51) Int. Cl.
*G12B 13/00* (2006.01)
*G01B 11/00* (2006.01)

(52) U.S. Cl. ............ 73/1.79; 250/252.1; 29/833; 382/141; 382/153; 702/104

(58) Field of Classification Search .................. 29/407.04–407.05, 407.09, 407.1, 832–833, 29/743, 739; 250/252.1; 73/1.79; 348/87, 348/94–95; 356/243.1, 614–615; 382/141, 382/147, 151, 153; 702/94–95, 104
See application file for complete search history.

(56) References Cited

U.S. PATENT DOCUMENTS

| | | | | |
|---|---|---|---|---|
| 4,875,285 A | * | 10/1989 | Haan et al. | 29/832 |
| RE35,027 E | | 8/1995 | Ragard | 29/740 |
| 5,539,992 A | * | 7/1996 | Woodhouse | 33/533 |
| 6,018,865 A | * | 2/2000 | Michael | 29/740 |
| 6,535,291 B1 | * | 3/2003 | Skunes et al. | 356/614 |
| 6,739,036 B1 | | 5/2004 | Koike et al. | 29/74.3 |
| 6,744,499 B1 | * | 6/2004 | Skunes et al. | 356/243.1 |

* cited by examiner

*Primary Examiner*—Thomas P. Noland
(74) *Attorney, Agent, or Firm*—Schmeiser, Olsen & Watts

(57) ABSTRACT

The present invention features a method whereby the vacuum nozzle of each extendable vacuum spindle in a multi-head component placement machine may be calibrated during component pick/place cycles. Calibration of each vacuum nozzle ensures accurate location of the vacuum nozzle over a component at a component pick station. This is particularly important with extremely small components where a slight misalignment of a vacuum nozzle with a component to be picked could result in a missed pick. Because of the vacuum nozzle inspection and calibration on the fly during the placement cycle, there is no slowdown of the placement machine cycle rate.

6 Claims, 4 Drawing Sheets

METHOD FOR IMPROVING PICK RELIABILITY IN A COMPONENT PLACEMENT MACHINE

RELATED APPLICATIONS

This application is a Continuation-in-part of U.S. patent application Ser. Nos. 10/307,848, filed Dec. 2, 2002 and 09/947,099, filed Sep. 5, 2001 and now U.S. Pat. No. 6,625,878. This application is also related to United States Reissued Pat. No. RE 35,027, which is hereby incorporated by reference.

FIELD OF THE INVENTION

This invention relates to component placement machines and, more particularly, to a method for calibrating vacuum nozzle positions to ensure accurate and reliable component pick during the machine's placement cycle.

BACKGROUND OF THE INVENTION

The use of sophisticated component placement machines in manufacturing printed circuit or similar cards, boards, panels, etc. is well known. The term printed circuit board (PCB) as used herein refers to any such electronic packaging structure. Typically, reels of tape-mounted circuit components are supplied to the placement machine by multiple feeders, each of which holds a reel of components. A pick station by each feeder assembly provides components. A rotatable frame is equipped with multiple pick/place heads, each having an extendable vacuum spindle that may be moved in the Z-axis (i.e., in and out) between and extended and a retracted position. The rotatable frame itself is mounted in a housing that may be moved along both the X and Y axes in a plane above a PCB being populated. Each vacuum spindle is equipped with a vacuum nozzle at its tip. The vacuum nozzles are sized and otherwise configured for use with each different size and style of component to be placed by the machine.

In operation, the housing with the rotatable frame holding the pick/place heads is moved to the pick station and the vacuum nozzle is positioned over a tape-mounted component. The vacuum spindle is lowered (i.e., extended) to a point where, upon application of vacuum, the component is removed from its backing tape, centered, and held tightly against the vacuum nozzle orifice. The rotatable frame is then moved to a point over the printed circuit board being assembled, the vacuum spindle is lowered, and the component is deposited on the printed circuit board at a predetermined location.

As component sizes have shrunk, the accuracy of placement of the vacuum nozzle over the component being picked has become more critical. Typically, calibration routines are performed upon machine setup or periodically as required for operation of the machine. However, with micro-miniature components, small variations occurring over time can quickly lead to miss-picks, as well as recognition and orientation problems of these components.

Currently, component placement assembly machines utilize multi-head frames to improve assembly speed. Each frame contains multiple pick/place heads with vacuum spindles, each vacuum spindle having its own vacuum nozzle. With multi-head machines, the need for real-time monitoring of the vacuum nozzle positions becomes even more critical. A vacuum nozzle's position may vary over time due to mechanical binding, build-up of debris, damage to the vacuum nozzle, thermal drift, etc. A changed vacuum nozzle position can be difficult to determine, manifesting its presence only through intermittent pick problems from the various feeders being used to supply the components for placement on the printed circuit boards and through component recognition and orientation errors. If the component itself is misaligned on the PCB, such an error can obviously affect proper operation of other components and larger assemblies.

SUMMARY OF THE INVENTION

The present invention provides a method whereby each vacuum nozzle position is calibrated during each placement cycle. Any deviation in a vacuum nozzle's position from an expected position may cause pick errors and component rejections that may degrade machine performance and cause defects in the PCBs being populated. The inventive process allows for accurate picking of components, especially very small ones. When the calibration process is applied to a multi-head frame, each vacuum nozzle can be calibrated during each placement cycle. Therefore, the calibration process in multi-head frames causes no slowdown of the placement machine cycle rate (i.e., placement machine throughput).

BRIEF DESCRIPTION OF THE DRAWINGS

A complete understanding of the present invention may be obtained by reference to the accompanying drawings, when considered in conjunction with the subsequent detailed description, in which.

DESCRIPTION OF THE PREFERRED EMBODIMENT

The present invention pertains to calibration of vacuum nozzle positions on the multi-head rotatable frame of a component placement machine used for assembling printed circuit boards.

Figure 1:
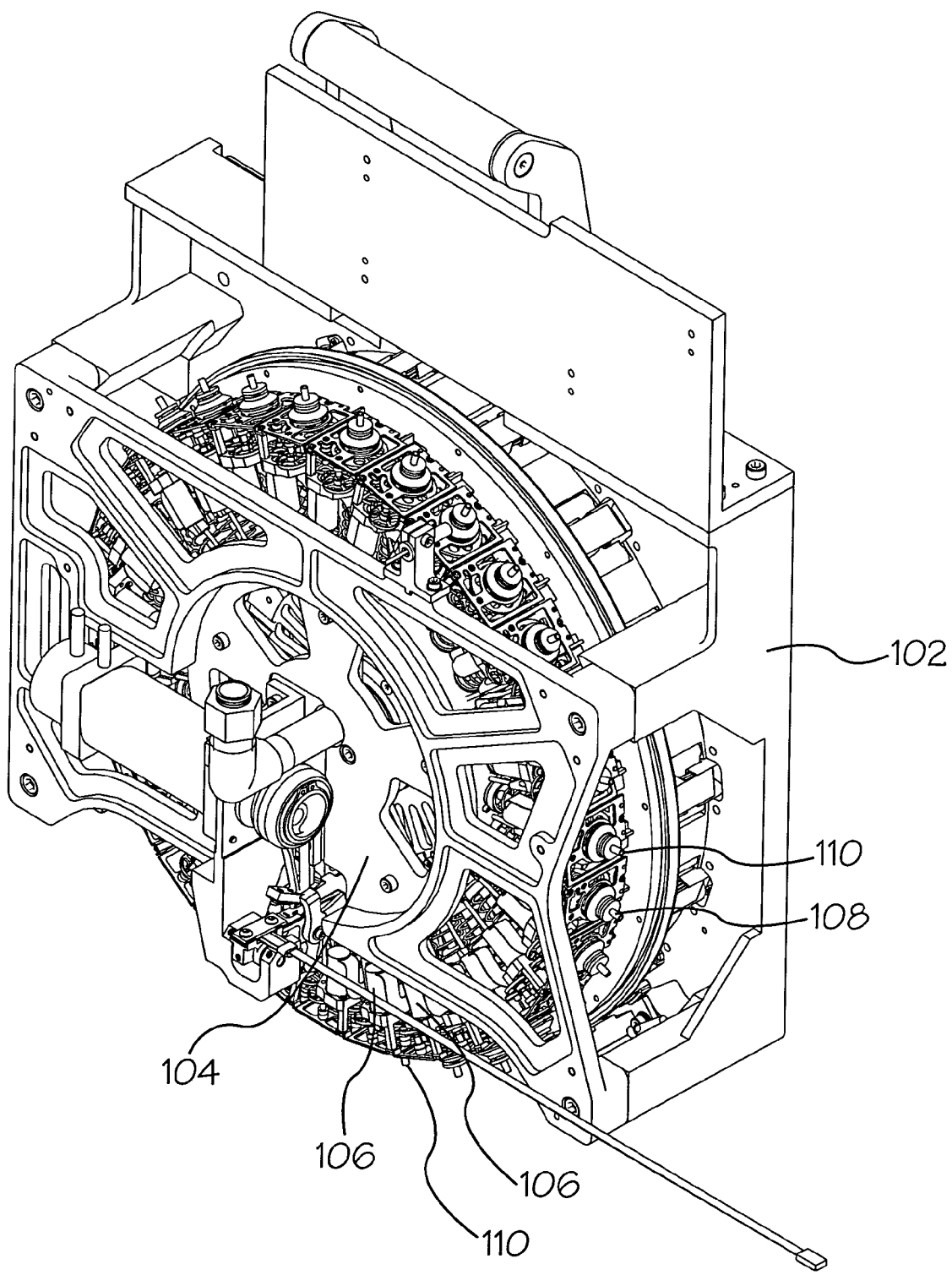
FIG. 1 is a side, schematic view of a multi-head frame showing a plurality of pick/place heads having vacuum spindles disposed thereupon.

Referring to FIG. 1, a schematic view of a housing 102 having a multi-pick/place head frame 104 rotatably mounted therein is shown. A plurality of pick/place heads 106 having vacuum spindles 108 are disposed radially around the frame 104. It will be recognized by those skilled in the component placement machine arts that a frame 104 may carry any number of pick/place heads 106 disposed radially about its perimeter. For purposes of this disclosure, a general case of n pick/place heads 106 is discussed.

Multi-pick/place head frames 104 are known and the concept forms no part of the present invention. Exemplary multi-pick/place head frames are described in U.S. Pat. No. RE. 35,027 and European Patent No. EP 0 315 799.

Figure 2:
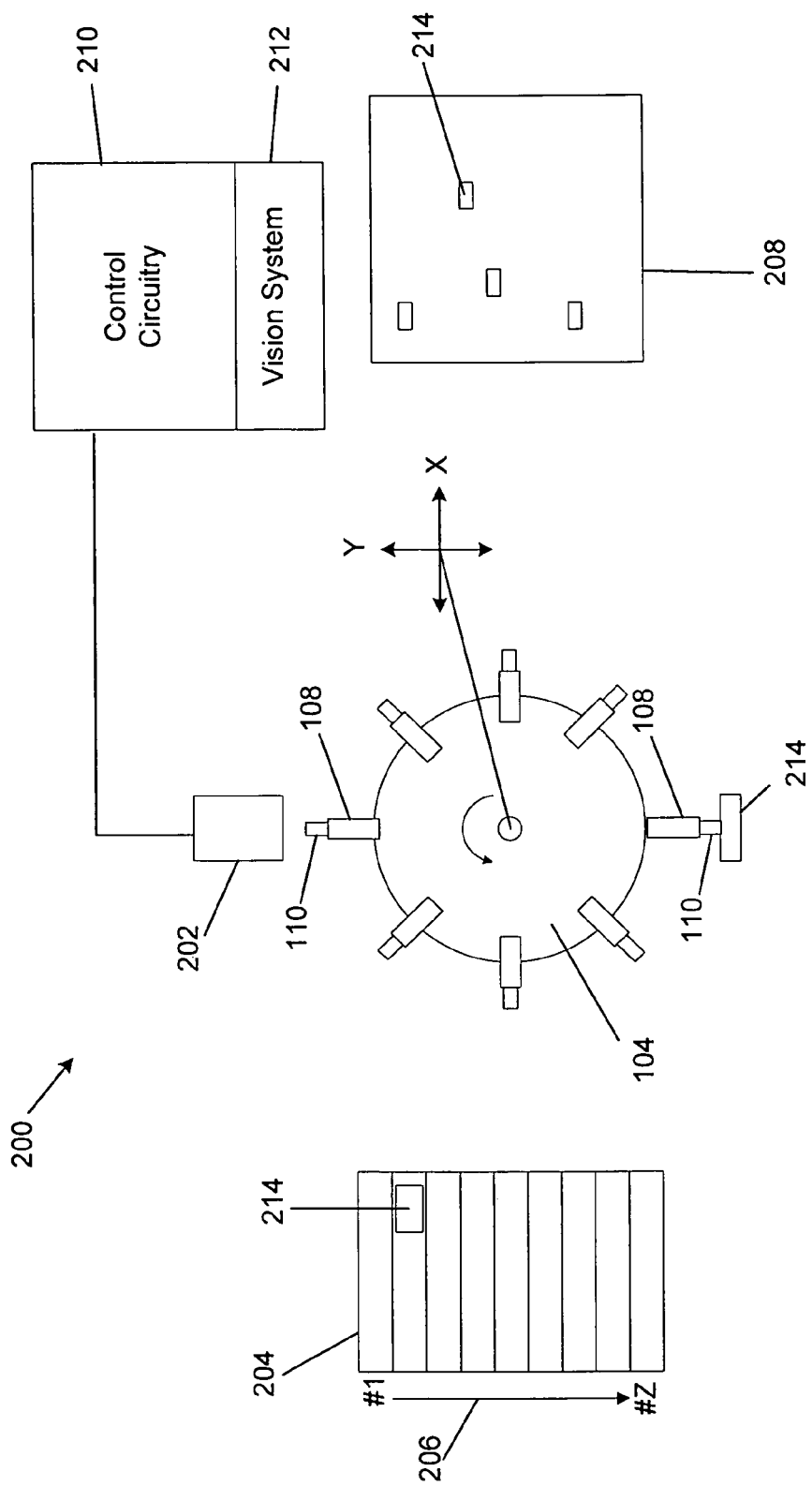
FIG. 2 is a simplified schematic diagram of a portion of a component placement machine adapted to practice the method of the invention.

FIG. 2 is a schematic block diagram 200 of a typical image acquisition arrangement for use in a component placement machine. At least one camera 202 is used to capture images, often at different magnifications or with different lighting conditions. The output of the camera 202 is connected to electronic signal processing and control circuitry 210 (i.e., the machine controller). The circuitry 210 controls the camera 202 and provides image capture functions.

The output of electronic signal processing and control circuitry 210 is connected to a vision system 212. It is also known to use a vision system at a process station in component placement machines. Typically, vision systems of the prior art are used to process images of components to facilitate identifying, positioning, and manipulating or orienting the components held against a vacuum nozzle 110 of a vacuum spindle 108. The present invention expands the use of such vision systems 212 to perform calibration of the vacuum nozzle 110 positions during each placement cycle performed by each vacuum nozzle 110 of the component placement machine. The inventive method is operative with any number of pick/place heads 106 and is not considered limited to any particular number thereof. It will also be recognized that the timing data (FIG. 3) used for purposes of disclosure may vary depending on the actual design of the rotatable frame 104.

In the embodiment chosen for purposes of disclosure, each active vacuum nozzle 110 on each vacuum spindle 108 of each pick/place head 106 on the rotatable frame 104 is imaged during each placement cycle. It will be recognized that in alternate embodiments, other methods including, but not limited to, imaging only a subset of the active vacuum nozzles 110 during a particular placement cycle, and imaging only a particular vacuum nozzle 110 every nth placement cycle could be implemented; therefore, the invention is not limited to the particular sequence chosen for purposes of disclosure.

When a vacuum nozzle 110 is picking up a component 214, its associated vacuum spindle 108 is in an extended position. At calibration time (i.e., when the vacuum nozzle 110 is adjacent the camera 202), the exact position of the vacuum nozzle 110 may be recorded, thereby re-calibrating the position of the vacuum nozzle 110. It is important that the vacuum spindle 108 likewise be in an extended position at calibration time. This is accomplished by an actuator, not shown, typically affixed to the housing 102, which extends the vacuum spindles 108 as they reach the camera 202. Such an actuator is described in detail in the included-by-reference applications cited hereinabove. It is preferable to calibrate the vacuum nozzles 110 while their associated vacuum spindles 108 are in their extended positions because a vacuum spindle's 108 eccentricity or other factors may cause inaccuracies in the vacuum nozzle calibration data if the calibration process is performed with the vacuum spindles 108 in their retracted position.

The position calibration data is typically placed in a lookup table, not shown, so that the most recent position data may be utilized by the placement machine for the next pick or place cycle involving that particular vacuum nozzle 110. While methods other than lookup tables could be used for storing vacuum nozzle calibration information, a fixed table of vacuum nozzles 110 associated with their position on the rotatable frame 104 has been found to be satisfactory. It will be recognized that other suitable data storage formats could also be used. Utilization of the calibration data by the inventive process is described in more detail hereinbelow.

Figure 3:
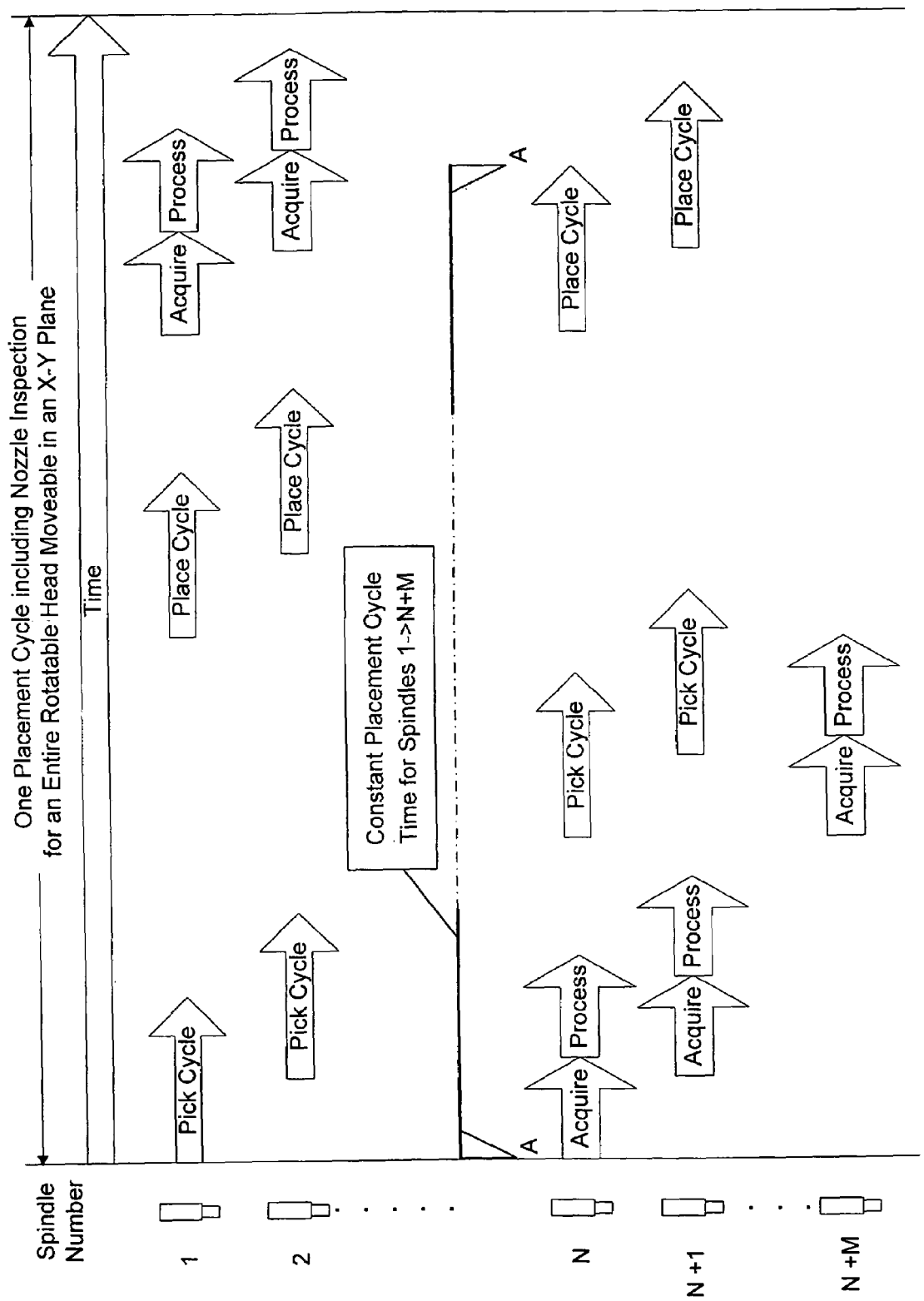
FIG. 3 is a timing diagram of vacuum nozzle image acquisition and processing during the placement cycle time in accordance with the inventive method.

Referring now to FIG. 3, a timing diagram for image acquisition and processing within a pick or place cycle is shown. As may be seen, image acquisition and processing (calibration) for each vacuum nozzle are always completed within a single pick or place cycle.

Figure 4:
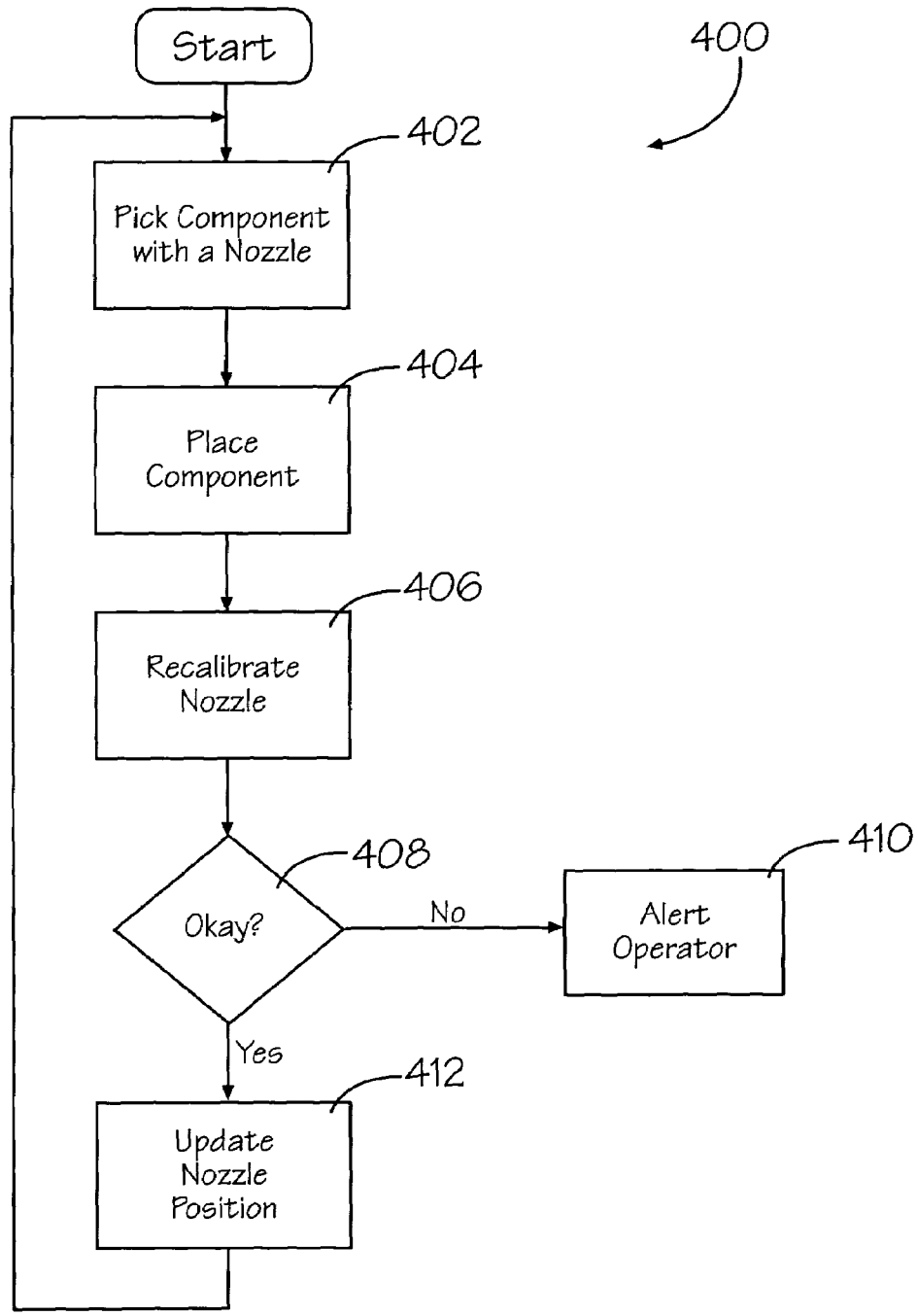
FIG. 4 is a simplified flow chart of the method of the invention.

Referring again to FIG. 2 and also now to FIG. 4, a flow chart 400 of the steps of the inventive method are shown. It is assumed that initial placement machine setup, vacuum nozzle installation, and calibration have been previously performed. The rotatable frame 104 is moved to a pick station 204, a particular vacuum spindle 108 is lowered, and a component 214 is picked, step 402. This calibration step 406 is repeated for the number of active pick/place heads 106 in the multi-head frame 104 (i.e., each active vacuum nozzle has picked-up a component). It is possible, however, that one or more pick/place heads 106 may be out of service and therefore may be ignored during any particular pick or place cycle.

The frame 104 is then moved under program control to the desired X-Y coordinates over the printed circuit board being assembled at the place station 208. The first vacuum spindle 108 is lowered and the component 214, picked in step 402, is placed onto the printed circuit board, step 404. After component placement begins, the empty vacuum nozzles 110 proceed to the camera 202 where they are recalibrated (i.e., their exact location is determined), step 406.

As the components 214 continue to be placed or when the frame 104 returns to the component pick station 204 and the previously calibrated vacuum nozzles 110 begin to acquire new components 214, the remaining vacuum nozzles 110 requiring calibration move to the camera 202. Therefore, during either the placement cycle or the pick cycle, this step is repeated for all vacuum nozzles 110. Details of the vacuum nozzle calibration process, step 406, are provided hereinbelow.

After image acquisition is complete, the image or images are processed, step 406. Processing involves locating the vacuum nozzle position within the acquired image. Assuming that the calibration process, step 406, is able to locate the vacuum nozzle 110 (i.e., the exact position/location of the vacuum nozzle 110 may be ascertained from one or more images from the camera 202), the new position is recorded, step 412, and the placement cycle continues, step 402. If a calibration problem occurs, step 408 (i.e., the exact vacuum nozzle 110 location cannot be determined or the location exceeds a predetermined tolerance range), the operator is alerted, step 410. Depending on the severity of the problem, the component placement machine could be automatically stopped or the pick/place head 106 with the problem vacuum nozzle 110 could be removed from active service until the problem is resolved.

It will be recognized that calibration of a particular vacuum nozzle 110 associated with a particular vacuum spindle 108 need not necessarily be performed. For example, if a vacuum nozzle 110 is not currently in active service, calibration is skipped. It will also be possible to define algorithms for periodically skipping calibration of a vacuum nozzle 110 if placement machine speed places an undue burden on the vision system 212, particularly image processing. Therefore, the invention is not considered limited to a method wherein each vacuum nozzle 110 is calibrated during each placement cycle.

Although the present invention has been described in connection with exemplary embodiments thereof, it will be appreciated by those skilled in the art that additions, deletions, modifications, and substitutions not specifically described may be made without departing from the spirit and scope of the invention as described and defined in the appended claims.

Having thus described the invention, what is desired to be protected by Letters Patent is presented in the subsequently appended claims.

The invention claimed is:

1. A method for calibrating vacuum nozzle positions in a component placement machine, the steps comprising:
    a) providing a component placement machine comprising a housing adapted for movement relative to a printed circuit board and having a frame rotatably attached thereto, said frame having a plurality of pick/place heads disposed thereupon, each of said pick/place heads comprising a vacuum spindle being extendable and having a vacuum nozzle at a distal end thereof, each of said plurality of vacuum nozzles being adapted for performing at least one of the operations of picking, holding, orienting, transporting, and placing a component relative to a printed circuit board;
    b) providing a vision system comprising at least one camera, said camera operatively disposed with respect to and contiguous with said housing;
    c) picking a component from a supply of components using at least one of said plurality of vacuum nozzles;
    d) placing said component on said printed circuit board with at least one of said plurality of vacuum nozzles;
    e) capturing an image of at least one of said plurality of vacuum nozzles after said placing with said camera;
    f) calibrating at least one of said plurality of vacuum nozzles using said captured image before said picking of next said component; and,
    wherein said capturing an image step (e) and calibrating step (f) are accomplished substantially completely during at least one of said placing step (e) and said picking step (c).

2. The method for calibrating vacuum nozzle position in a component placement machine as recited in claim 1, wherein said calibrating step (f) comprises:
    i) extending at least one said plurality of vacuum spindles to an extended position, before said capturing an image using said vision system; and
    ii) determining a position of at least one of said plurality of vacuum nozzles within said captured image thereby creating a calibrated vacuum nozzle position for at least one of said plurality of vacuum nozzles.

3. The method for calibrating vacuum nozzle position in a component placement machine as recited in claim 2, wherein said picking step (c) further comprises using said calibrated nozzle position for picking a subsequent component.

4. The method for calibrating vacuum nozzle position in a component placement machine as recited in claim 1, wherein said calibrating step (f) further comprises:
    iii) storing information representative of said calibrated vacuum nozzle position.

5. The method for calibrating vacuum nozzle position in a component placement machine as recited in claim 1, wherein said captured image of step (e) is captured in a plane.

6. The method for calibrating vacuum nozzle position in a component placement machine as recited in claim 1, wherein said vision system comprises at least one camera adapted to capture an image of at least one of said plurality of vacuum nozzles.

* * * * *

UNITED STATES PATENT AND TRADEMARK OFFICE
CERTIFICATE OF CORRECTION

PATENT NO. : 7,040,137 B1
APPLICATION NO. : 10/627927
DATED : May 9, 2006
INVENTOR(S) : Gieskes It is certified that error appears in the above-identified patent and that said Letters Patent is hereby corrected as shown below:

Column 5
Line 32, delete "(e)" and insert -- (d) --

Signed and Sealed this

Thirteenth Day of March, 2007

JON W. DUDAS
*Director of the United States Patent and Trademark Office*